US007672805B2

(12) United States Patent
Kushnick et al.

(10) Patent No.: US 7,672,805 B2
(45) Date of Patent: Mar. 2, 2010

(54) SYNCHRONIZATION OF MODULES FOR ANALOG AND MIXED SIGNAL TESTING IN AN OPEN ARCHITECTURE TEST SYSTEM

(75) Inventors: Eric Barr Kushnick, Santa Clara, CA (US); Kenji Inaba, Tokyo (JP); Toshiyuki Miura, Tokyo (JP)

(73) Assignee: Advantest Corporation, Ora-Gun, Gunma (JP)

( * ) Notice: Subject to any disclaimer, the term of this patent is extended or adjusted under 35 U.S.C. 154(b) by 1629 days.

(21) Appl. No.: 10/779,031

(22) Filed: Feb. 13, 2004

(65) Prior Publication Data

US 2005/0114550 A1 May 26, 2005

Related U.S. Application Data

(60) Provisional application No. 60/525,786, filed on Nov. 26, 2003.

(51) Int. Cl.
*G01M 19/00* (2006.01)
(52) U.S. Cl. ........................................ 702/125; 714/744
(58) Field of Classification Search ............. 702/79–80, 702/124–125, 176–178; 700/11–12, 14, 700/79–81, 83–84; 714/55, 707, 744, 798, 714/814–815
See application file for complete search history.

(56) References Cited

U.S. PATENT DOCUMENTS 4,441,098 A * 4/1984 Borras et al. ................. 341/20
4,472,820 A * 9/1984 Borras ......................... 377/52
4,707,834 A * 11/1987 Frisch et al. ................. 714/31
4,731,577 A   3/1988 Logan et al.
4,853,839 A * 8/1989 Nichols et al. .............. 700/61
5,014,002 A   5/1991 Wiscombe et al.

(Continued)

FOREIGN PATENT DOCUMENTS

EP            0 147 135 A        7/1985

(Continued)

OTHER PUBLICATIONS

Patent Abstracts of Japan, vol. 2000, No. 11, Jan. 3, 2001 and JP 2000-235061 A, published Aug. 29, 2000.

(Continued)

*Primary Examiner*—Eliseo Ramos Feliciano
*Assistant Examiner*—Mary C Baran
(74) *Attorney, Agent, or Firm*—Morrison & Foerster LLP

(57) ABSTRACT

A method and apparatus for synchronizing digital and analog/mixed signal modules in a test site of an open architecture test system is disclosed. Event triggers from digital modules are routed to an ASYNC module, which selectively distributes them to analog/mixed signal modules. When an event occurs, the trigger may activate an analog/mixed signal module to perform a certain operation. The ASYNC module may also receive triggers from the analog/mixed signal modules and selectively distribute them back to the digital modules or analog/mixed signal modules. The digital modules can be programmed to wait for an analog/mixed signal module to complete an operation, as indicated by a trigger received from that analog/mixed signal module, before continuing. Because embodiments of the present invention enable synchronization of digital and analog/mixed signal modules under pattern control, synchronization can be very precise and repeatable as compared to synchronization from a site controller.

22 Claims, 3 Drawing Sheets

U.S. PATENT DOCUMENTS

| | | | |
|---|---|---|---|
| 5,116,244 A | | 5/1992 | Cartier et al. |
| 5,137,022 A | * | 8/1992 | Henry .................. 607/32 |
| 5,241,961 A | * | 9/1993 | Henry .................. 607/32 |
| 5,477,159 A | | 12/1995 | Hamling et al. |
| 5,558,541 A | | 9/1996 | Botka et al. |
| 5,903,143 A | | 5/1999 | Mochizuki et al. |
| 5,944,548 A | | 8/1999 | Saito |
| 5,969,535 A | | 10/1999 | Saito |
| 6,028,439 A | | 2/2000 | Arkin et al. |
| 6,313,653 B1 | | 11/2001 | Takahashi et al. |
| 2001/0025957 A1 | | 10/2001 | Takahashi |

FOREIGN PATENT DOCUMENTS

| | | |
|---|---|---|
| GB | 2 195 029 A | 3/1988 |
| JP | 2000-048920 | 2/2000 |
| JP | 2000-235061 | 8/2000 |
| WO | WO-2005/052613 A1 | 6/2005 |

OTHER PUBLICATIONS

Patent Abstracts of Japan, vol. 2000, No. 5, Sep. 14, 2000 and JP 2000-048920, published Feb. 18, 2000.

International Search Report mailed Mar. 16, 2005, for PCT Application No. PCT/JP2004/017971, filed Jun. 9, 2005, two pages.

Written Opinion mailed Mar. 16, 2005, for PCT Application No. PCT/JP2004/017971, filed Jun. 9, 2005, six pages.

* cited by examiner

SYNCHRONIZATION OF MODULES FOR ANALOG AND MIXED SIGNAL TESTING IN AN OPEN ARCHITECTURE TEST SYSTEM

CROSS-REFERENCE TO RELATED APPLICATIONS

This application claims priority to U.S. provisional application Ser. No. 60/525,786 entitled "Test Head Modules for RF and Mixed-Signal/Analog Testing," filed Nov. 26, 2003, and is related to U.S. provisional application Ser. No. 60/447,839 entitled "Method and Structure to Develop a Test Program for Semiconductor Integrated Circuits," filed Feb. 14, 2003, and U.S. provisional application Ser. No. 60/449,622 entitled "Method and Apparatus for Testing Integrated Circuits," filed Feb. 24, 2003, the contents of which are incorporated herein by reference for all purposes.

FIELD OF THE INVENTION

This invention relates to a test system for testing semiconductor devices such as integrated circuits (ICs), and more particularly, to the synchronization of digital and analog/mixed signal modules in an open architecture test system.

BACKGROUND OF THE INVENTION

A major reason for the high cost of test equipment is the specialized nature of conventional tester architecture. Each tester manufacturer has a number of tester platforms that are not only incompatible across companies, but also incompatible across platforms. Because of these incompatibilities, each tester requires its own specialized hardware and software components that cannot be used on other testers.

Because of the dedicated nature of conventional tester architecture, all hardware and software must remain in a fixed configuration for a given tester. To test an IC, a dedicated test program is developed that uses some or all of the tester capabilities to define the test data, signals, waveforms, and current and voltage levels, as well as to collect the device under test (DUT) response and determine DUT pass/fail.

To increase flexibility and lower the cost of test systems, it would be desirable to connect and use test modules from multiple vendors while testing ICs. However, because of the specialized and proprietary nature of the hardware and software in each vendor's test modules, heretofore it has been difficult or impossible to plug-in and use the test modules from multiple vendors.

In response to this need, an open architecture test system has been developed that allows plug and play of different modules from different vendors. This open architecture test system allows reconfigurability and scalability of the system in terms of number and type of DUTs and test modules.

A block diagram of a high level perspective of an open architecture test system 100 is illustrated in FIG. 1. In FIG. 1, the modules 102 may be functional units such as a digital pincard, and analog card, a device power supply (DPS), or instruments such as a waveform generator. The physical connections to the modules 102 may be obtained through a module connection enabler 104 that includes a switch matrix network 106. The switch matrix network 106 may include logic, traces, and pins. The system controller 108 is typically the point of interaction for a user. The system controller 108 provides a gateway to the site controllers 110 and synchronization of the site controllers 110 in a multi-site/multi-DUT environment. The system controller 108 and multiple site controllers 110 may operate in a master-slave configuration.

The system controller 108 controls the overall system operation and determines that functions that a particular site controller 110 should perform. Each site controller 110 is itself sufficient to test a DUT 112. The site controller 110 controls and monitors the operation of various modules 102 within a test site 114. A test site 114 is a collection of modules 102 that service the testing of a single DUT 112. A site controller 110 can control one or multiple test sites 114.

The overall platform consists of a hardware and software framework that provides interfaces through which various hardware and software modules can be employed. The architecture is a modularized system with module control software and a communication library that allows module-to-module, site controller to module, site controller-to-site controller, and system controller to site controller communication.

The open architecture test system allows different vendor hardware and software to be developed, certified and integrated reliably into the test system. The open architecture test system allows deployment of test modules in a plug-and-play manner. Each test module may be replaced with another test module from a different vendor. The only restriction is that each test module must follow the interface requirements of the integrating framework. Thus, vendor hardware could be any functional unit, such as a digital pin card, an analog card, a device power supply (DPS), etc.

Because the timing and interaction of modules in a test site may be critical to performing an accurate test of the DUT, there is a need to provide for the synchronization of the modules testing the corresponding DUT.

SUMMARY OF THE INVENTION

The present invention is directed to synchronizing a group of test head modules in a test site designed to perform RF and/or mixed-signal/analog testing when installed in the test head of an open architecture test system. Modules from different manufacturers can be used in the test site, as long as the modules conform to certain rules such as the connector type, the pinouts of the connectors, levels on the pins, and the like.

In particular, embodiments of the present invention enable event triggers from digital modules to be routed to an analog synchronization (ASYNC) module, which selectively distributes them to analog/mixed signal modules. When an event occurs, which is a point in time in the pattern when something is to happen, the trigger may activate an analog/mixed signal module to perform a certain operation. For example, when testing a DUT with a digital-to-analog converter (DAC), the digital module may generate a digital pattern that is the equivalent of a sine wave, and the DAC in the DUT may reproduce the corresponding sine wave. The sine wave may then be fed into a digitizer in an analog/mixed signal module, and a trigger from the digital module may be used to tell the analog/mixed signal module when that sine wave is available for capture, which might include some settling time and filter delays.

The ASYNC module may also receive triggers from the analog/mixed signal modules and selectively distribute them back to the digital modules. The digital modules can be programmed to wait for an analog/mixed signal module to complete an operation, as indicated by a trigger received from that analog/mixed signal module, before continuing. The ASYNC module may also receive triggers from the analog/mixed signal modules and selectively distribute them to other analog/mixed signal modules, to initiate the operation of that analog/mixed signal module in a preferred sequence.

Because embodiments of the present invention enable synchronization of digital and analog/mixed signal modules under pattern control, synchronization can be very precise and repeatable as compared to synchronization from a site controller.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Overview. The present invention is directed to synchronizing a group of test head modules in a test site designed to perform RF and/or mixed-signal/analog testing when installed in the test head of an open architecture test system. Modules from different manufacturers can be used in the test site, as long as the modules conform to certain rules such as the connector type, the pinouts of the connectors, levels on the pins, and the like.

In particular, embodiments of the present invention enable event triggers from digital modules to be routed to an ASYNC module, which selectively distributes them to analog/mixed signal modules. When an event occurs, which is a point in time in the pattern when something is to happen, the trigger may activate an analog/mixed signal module to perform a certain operation. For example, when testing a DUT with a digital-to-analog converter (DAC), the digital module may generate a digital pattern that is the equivalent of a sine wave, and the DAC in the DUT may reproduce the corresponding sine wave. The sine wave may then be fed into a digitizer in an analog/mixed signal module, and a trigger from the digital module may be used to tell the analog/mixed signal module when that sine wave is available for capture, which might include some settling time and filter delays.

The ASYNC module may also receive triggers from the analog/mixed signal modules and selectively distribute them back to the digital modules. The digital modules can be programmed to wait for an analog/mixed signal module to complete an operation, as indicated by a trigger received from that analog/mixed signal module, before continuing. The ASYNC module may also receive triggers from the analog/mixed signal modules and selectively distribute them to other analog/mixed signal modules, to initiate the operation of that analog/mixed signal module in a preferred sequence.

Because embodiments of the present invention enable synchronization of digital and analog/mixed signal modules under pattern control, synchronization can be very precise and repeatable as compared to synchronization from a site controller.

Figure 1:
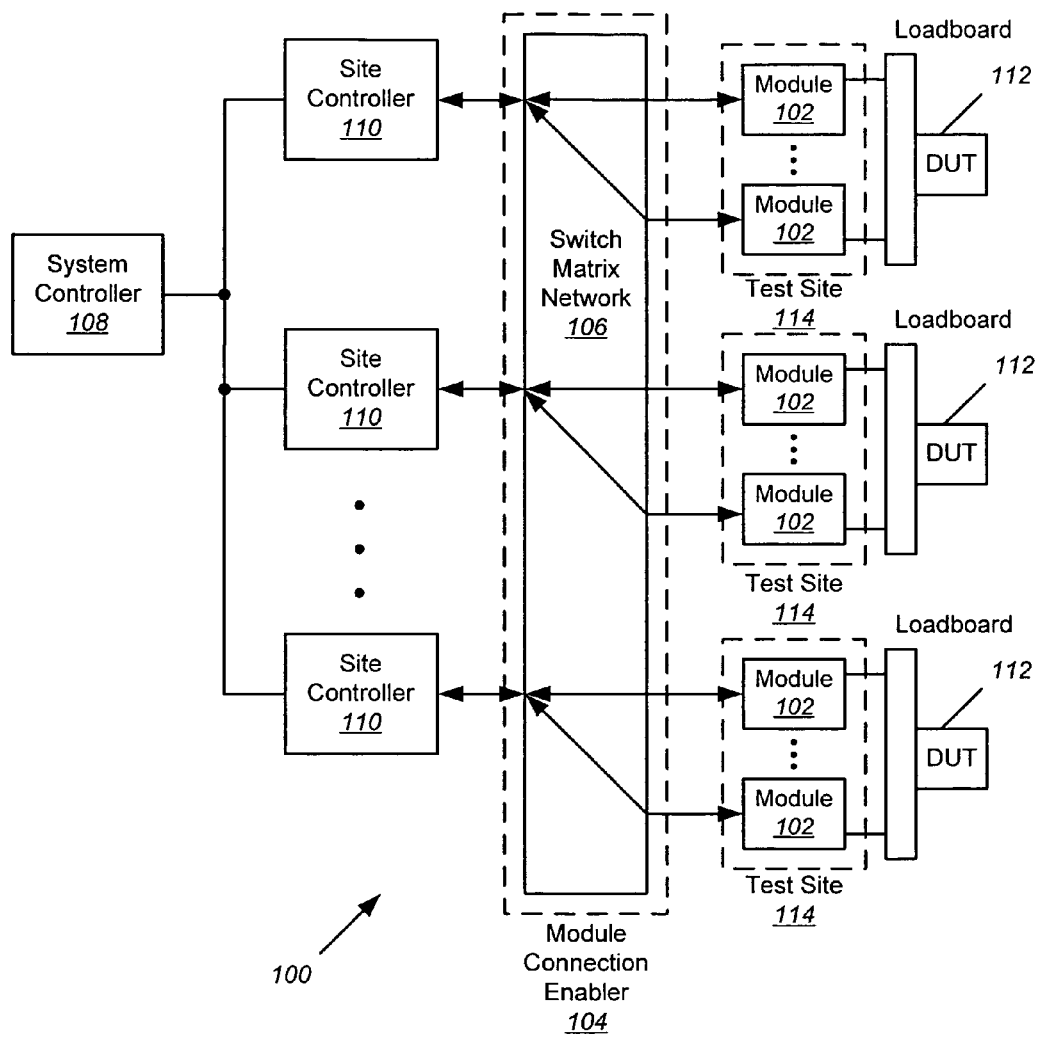
FIG. 1 is an exemplary block diagram of an open architecture test system.
Figure 2:
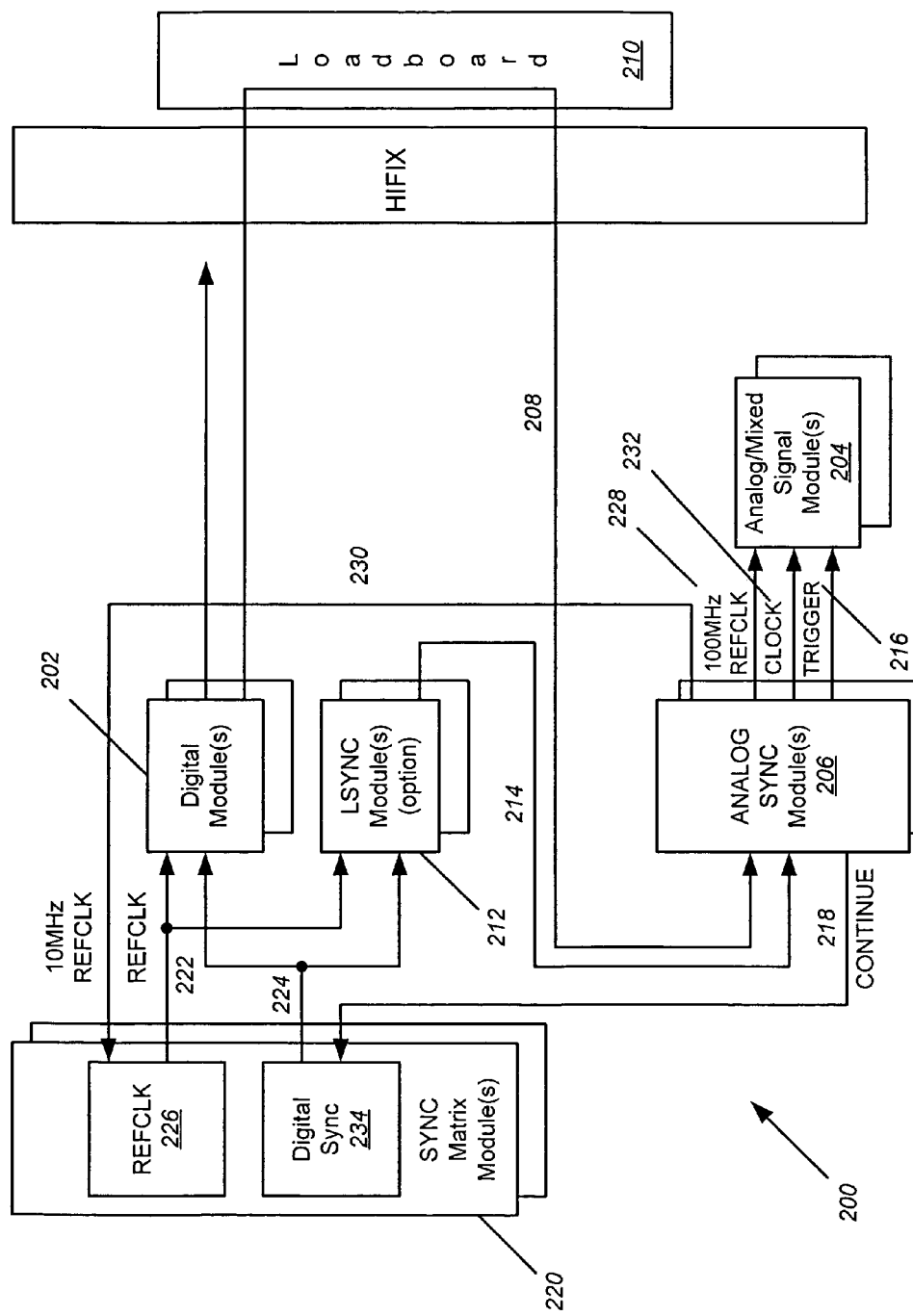
FIG. 2 is an exemplary system synchronization block diagram for an open architecture test system according to embodiments of the present invention.

System synchronization. FIG. 2 is an exemplary open architecture test system 200 synchronization block diagram according to embodiments of the present invention. The open architecture test system synchronization of FIG. 2 enables the synchronization of digital modules and analog/mixed-signal modules in the same test site.

Digital and LSYNC modules. The test system 200 of FIG. 2 may include digital modules 202 and logic synchronization (LSYNC) modules 212. LSYNC modules 212 are essentially digital modules 202 without pin electronics (e.g. driver and comparator). The digital modules 202 and LSYNC modules 212 operate under pattern control (i.e. they operate in accordance with patterns stored within their memories) to generate a sequence of output signals or triggers on their pins.

The digital modules 202 and LSYNC modules 212 may be started based on patterns stored in their memory. The patterns determine whether the outputs of the digital modules 202 or LSYNC modules 212 are to be high or low, or what to expect on their inputs, at very specific times (e.g. 100 picosecond accuracy). Pattern management software is also stored in memory.

Sync matrix modules. Synchronization of the patterns stored in memory in the digital modules 202 and LSYNC modules 212 is achieved through one or more sync matrix modules 220. The digital sync block 234 within a sync matrix module 220 is a control source for pattern generators in the digital modules 202 and LSYNC modules 212. The patterns in the digital and LSYNC modules can be started, stopped, continued and otherwise controlled in unison with high accuracy by utilizing the same reference clock 222 and control signals 224 coming from the digital sync block 234.

Analog/mixed-signal modules. The test system also includes analog/mixed-signal modules 204. The analog/mixed signal modules 204 may contain triggerable devices such as arbitrary waveform generators (AWGs) (which could in turn modulate a radio frequency (RF) source) and digitizers. It may be desirable for the AWGs or digitizers to be triggered a specified time after the digital modules 202 have sent certain output signals to the DUT so that the DUT is configured in a particular fashion prior to receiving the output of the AWG or an RF source.

For example, an AWG in an analog/mixed signal module 204 can be started by a trigger 208 from a digital module 202, and the AWG may run until the signal has stabilized at the DUT. The digital module 202 may then trigger multiple digitizers, and trigger the AWG to go to the next step and generate the next waveform, and the cycle can be repeated. The digitizers or the AWG can also send a trigger signal 216 back to the digital module 202 instructing it to continue the digital pattern and perform other digital tests. Therefore, embodiments of the present invention provide numerous possibilities for sequencing devices.

Conventional synchronization mechanisms. One way to synchronize the digital modules 202, LSYNC modules 212, and analog/mixed signal modules 204 would be to have the site controller (not shown in FIG. 2) individually communicate with the modules and tell them when to start and stop. However, the site controller would only be able to synchronize the modules to within tens of microseconds, and at times much tighter synchronization is needed. When testing high-speed DUTs, the time synchronization between triggering an analog/mixed signal module 204 and observing an output using a digital module 202 may need to be on a nanosecond scale instead of tens of microseconds.

ASYNC module. Rather than using a site controller for synchronization, embodiments of the present invention utilize an ASYNC module 206 to assist in synchronizing the digital and analog modules. The digital modules 202 or LSYNC modules 212 can be programmed such that in the middle of a pattern, a pulse or some output can be transmitted to the ASYNC module 206.

For example, the ASYNC module 206 may receive an event trigger 214 from an LSYNC module 212. Alternatively, a digital module 202 may also send a performance board (PB) trigger 214 to the ASYNC module 206 that may be first routed to a PB (loadboard) 210 and then to the ASYNC module 206. (Note that the loadboard 210 is a board upon which the DUT is mounted, and serves to connect the DUT to the test site.)

PB triggers 208 may be utilized in lower-cost, less-flexible test sites that do not include an LSYNC module 212. PB triggers 208 are first routed to the loadboard 210 because all other outputs from the digital modules 202 are also routed to the loadboard 210. If the test site includes an LSYNC module 212, then the PB triggers 208 may not be utilized. Multiple PB triggers 208 (e.g. four) may be generated from each digital module 202 and connected to the ASYNC module 206 through the loadboard 210. Multiple event triggers 214 (e.g. four) may also be generated from each LSYNC module 212 and connected directly into the ASYNC module 206. If both PB triggers 208 and event triggers 214 are present in a test site, then either or both may be used.

The ASYNC module 206 is programmable by the site controller to route these triggers to one or more (e.g. 16) analog/mixed signal modules 204 on trigger lines 216. Embodiments of the present invention are particularly suited to open architecture test systems. By centrally distributing triggers 216 in parallel from the ASYNC module 206 to the analog/mixed signal modules 204, if one analog/mixed signal module 204 has a problem, which is more likely in open architecture test systems due to modules being designed and manufactured by different companies, it should not prevent the other analog/mixed signal modules 204 from operating.

The analog/mixed signal modules 204 may in turn send trigger signals 216 back to the ASYNC module 206, which would then access digital control lines called "continue" lines 218. The continue signals 218 are sent to the digital sync block 234 in the sync matrix module 220, which would then control the starting, stopping, or continuation of pattern generation in the digital modules 202 and LSYNC modules 212 via control signals 224.

The ASYNC module 206 is also programmable by the site controller to route one or more clock sources to one or more (e.g. 16) analog/mixed signal modules 204 on clock lines 232. By centrally distributing clocks 232 in parallel from the ASYNC module 206 to the analog/mixed signal modules 204, if one analog/mixed signal module 204 has a problem, which is more likely in open architecture test systems due to modules being designed and manufactured by different companies, it should not prevent the other analog/mixed signal modules 204 from operating.

System clocks. To synchronize all the analog/mixed signal modules 204, LSYNC modules 212 and digital modules 202, there must be a single reference source for all generated system clocks. If the test site only contains digital modules 202 and LSYNC modules 212, the reference source can be an internally generated REFCLK 222 from the sync matrix module 220. The sync matrix module 220 may include a reference clock source 226 such as, for example, a 250 MHz reference clock source for generating REFCLK 222.

However, if the test site includes analog/mixed signal modules 204, these modules may require a higher purity, lower jitter reference clock source than the digital modules 202 or LSYNC modules 212. In one embodiment of the present invention, the ASYNC module 206 provides a higher purity, lower jitter reference clock 228 such as, for example, a 100 MHz reference clock. In order to synchronize the digital modules 202 and LSYNC modules 212 to this higher purity, lower jitter reference clock 228, the reference clock 228 is divided down to lower frequency reference clock 230. In the example of FIG. 2, the 100 MHz reference clock 228 may be divided by ten to 10 MHz (see lower frequency reference clock 230) and sent to the sync matrix module 220 to act as a reference to which the 250 MHz reference clock source 226 may lock using a phase-locked loop (PLL) so that the reference clock 228 from the ASYNC module 206 becomes the reference source for the entire test site. Note, however, that if the test site contains no analog/mixed signal modules 204 or modules that require a higher purity, lower jitter reference clock source, then there may be no higher purity, lower jitter reference clock 228 or lower frequency reference clock 230 generated within the test site. In such an instance, the reference clock source 226 in the sync matrix module 220 may generate REFCLK 222 from a crystal oscillator.

Figure 3:
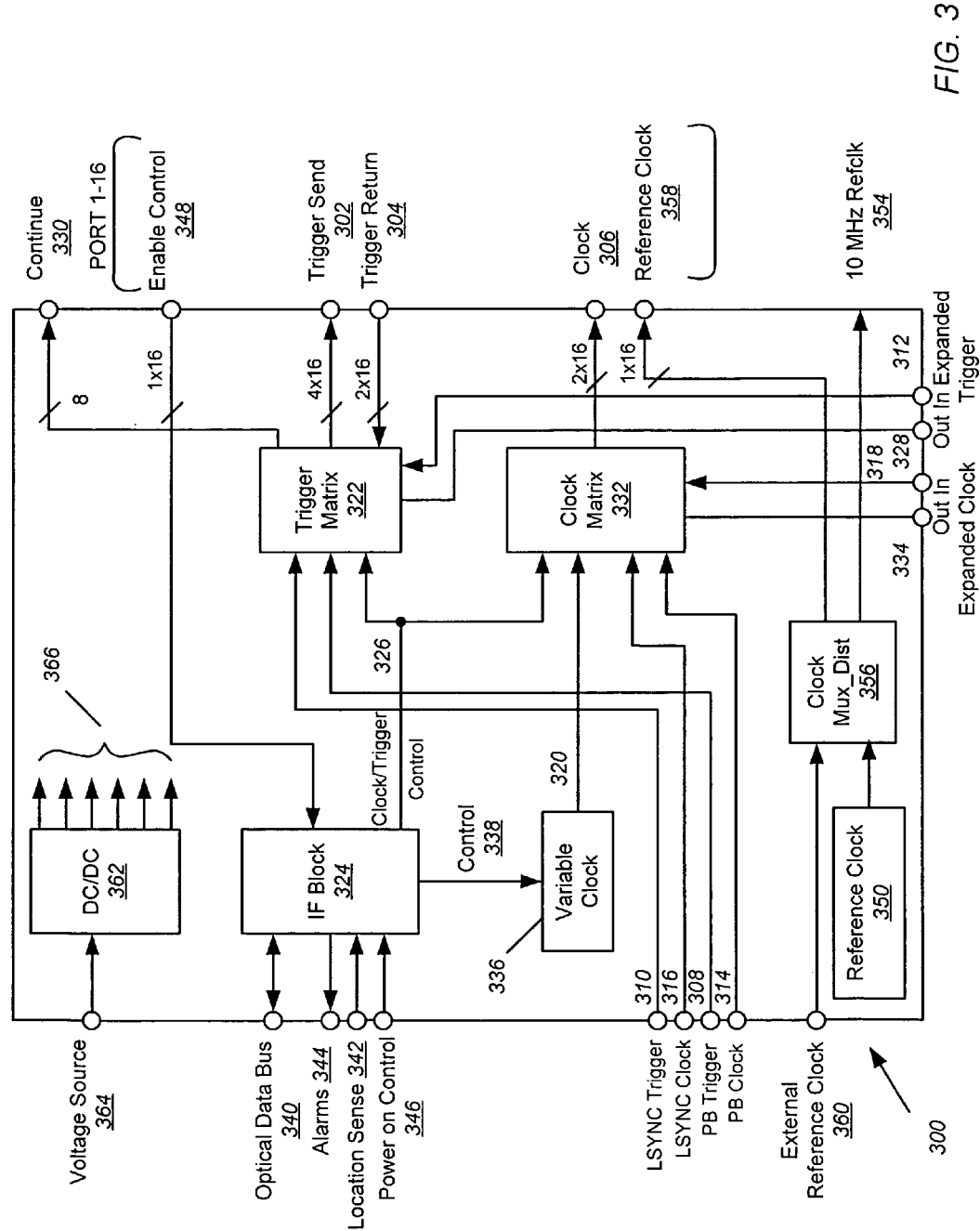
FIG. 3 illustrates an exemplary block diagram of an ASYNC module according to embodiments of the present invention.

Details of ASYNC module. FIG. 3 illustrates an exemplary block diagram of an ASYNC module 300 according to embodiments of the present invention. The ASYNC module 300 can send out one or more (e.g. four) trigger send lines 302, one or more (e.g. two) trigger return lines 304, and one or more (e.g. two) clock lines 306 to each of one or more (e.g. up to 16) analog/mixed signal modules. In general, the ASYNC module 300 may receive triggers from digital modules at 308, LSYNC modules at 310, analog/mixed signal modules via 304, and other ASYNC modules at 312, and route these triggers to selected analog/mixed signal modules. The ASYNC module 300 also receives clocks from digital modules at 314, LSYNC modules at 316, and other ASYNC modules at 318, or generates a variable clock 320 from within the ASYNC module 300, and routes them to selected analog/mixed signal modules.

Trigger Matrix. The trigger matrix 322 can send one or more (e.g. four) triggers 302 to each of a number (e.g. 16) of analog modules, and can receive one or more (e.g. two) triggers 304 from each of the analog modules. In embodiments of the present invention the trigger matrix 322 may utilize any type of digital logic or other circuitry well understood by those skilled in the art to implement the equivalent of a switch matrix. In one embodiment, a full nonblocking crossbar switch, which enables any of the trigger inputs to the trigger matrix 322 to be routed to any of the trigger outputs 302, may be employed. The trigger matrix 322 is configured by clock/trigger control lines 326 from an interface (IF) block 324 to determine which triggers will be selected and which analog/mixed signal modules will receive the selected triggers. The trigger matrix 322 can also be configured to send one or more triggers out on one or more (e.g. eight) continue outputs 330 (which correspond to the continue lines 218 of FIG. 2), which control the starting, stopping, or continuation of pattern generation in the digital modules and LSYNC modules.

The trigger inputs to the trigger matrix 322 include the LSYNC triggers 310 (which correspond to the event triggers 214 in FIG. 2) or the PB triggers 308 (which correspond to the PB triggers 208 in FIG. 2). Note that the PB triggers 308 could also include triggers from other sources such as external test equipment. The trigger inputs also include triggers from the expanded trigger input 312. If another ASYNC module was connected to the ASYNC module 300 of FIG. 3, triggers from the other ASYNC module could be received through the expanded trigger input 312. Note that this other ASYNC module would be identical to the ASYNC module 300 shown in FIG. 3, and would send triggers out on expanded trigger output 328. The trigger inputs to the trigger matrix 322 also include the trigger returns 304 from the analog modules.

Clock Matrix. The clock matrix 332 can send one or more (e.g. two) clocks 306 to each of a number (e.g. 16) of analog/mixed signal modules. In embodiments of the present invention the clock matrix 332 may utilize any type of digital logic or other circuitry well understood by those skilled in the art to implement the equivalent of a switch matrix. In one embodiment, a full nonblocking crossbar switch, which enables any of the clock inputs to the clock matrix 332 to be routed to any of the clock outputs 306, may be employed. The clock matrix 332 is configured by clock/trigger control lines 326 from an interface (IF) block 324 to determine which clocks will be selected and which analog/mixed signal modules will receive the selected clocks.

The clock inputs to the clock matrix 332 include pattern controlled LSYNC clocks 316 from the LSYNC module or PB clocks 314 from the digital modules. The clock inputs also include clocks from the expanded clock input 318. If another ASYNC module was connected to the ASYNC module 300 of FIG. 3, clocks from the other ASYNC module could be received through the expanded clock input 318. Note that this other ASYNC module would be identical to the ASYNC module 300 shown in FIG. 3, and would send clocks out on expanded clock output 334.

The clock inputs to the clock matrix 332 also include the variable clock 320 from a variable clock generator 336. The variable clock generator 336 is a higher purity clock source that can be used by the analog/mixed signal modules. The frequency of the variable clock generator 336 is programmable using control bits 338 from the IF block 324, which receives these control bits over a bus such as an optical data bus 340 from the site controller.

Note that both the trigger matrix 322 and the clock matrix 332 are typically configured once for each DUT type under program control from the site controller, but it could be reconfigured at any time during the test.

IF block. The IF block 324 is connected to the data bus (e.g. optical data bus 340), which is the main control bus in the open architecture test system. The optical data bus 340 is received from a bus switch module (not shown) that allows the optical data bus 340 to be received from any of one or more of the site controllers. Although the bus switch module is typically configured once at the beginning of the test program, it may also be configured on the fly. The optical bus sends commands from the site controller to control the ASYNC module 300. The IF block 324 interprets the data on the optical data bus 340 and then sends the appropriate control lines out to the trigger matrix 322, the clock matrix 332, and the variable clock source 336.

The IF block 324 also has a location sense input 342 that makes a connection when plugged into a slot in the test head and sends a signal back to the site controller via the optical data bus 340 that indicates the specific slot into which the ASYNC module 300 has been placed. The optical bus structure may thereafter be modified, depending on the slot location. Note that this location sense input is preferably contained in each module in the test site.

The analog/mixed signal modules may contain sensors that detect functional errors, overheating, and the like, and send sensor output signals (not shown) back to the IF block 324 (and sometimes bypass the IF block 324) in the ASYNC module 300. The IF block 324 receives these sensor outputs and generates alarm signals 344 that are sent out to the site controller or tester mainframe to turn off power to a module if there is a fault on the module.

The IF block 324 also may receive an enable control line 348 from each module that is located in a slot to inform the IF block 324 that it is an active slot. This will enable the module to receive and send trigger and clock signals from the ASYNC module 300. The IF block 324 will allow triggers and clocks to be sent to a particular slot only if it has received an enable control signal 348 from a module in that slot. Note that the test program information received over the optical data bus 340 may assume that certain modules are present in the test site, but because not all modules may be present, the enable control lines 348 provide a hardware check. This is particularly advantageous in an open architecture test system where any module can be plugged into any slot.

Reference clock and clock mux/distribution block. As described above, the analog/mixed signal modules may require a higher purity, lower jitter reference clock source than the digital modules. In one embodiment of the present invention, the ASYNC module 300 includes a reference clock generator 350 to provide this higher purity, lower jitter reference clock 352 such as, for example, a 100 MHz reference clock. This reference clock 352 is then distributed to one or more (e.g. 16) analog/mixed signal modules at 358 though a clock multiplexer/distribution block 356. Furthermore, in order to synchronize the digital and LSYNC modules to this higher purity, lower jitter reference clock 352, the reference clock 352 may also be divided down to a lower frequency reference clock 354 in the clock multiplexer distribution block 356. In the example of FIG. 3, the 100 MHz reference clock 352 may be divided by ten to 10 MHz (see lower frequency reference clock 354). In addition, an external reference clock input 360 may be used to bring in a high purity clock as a substitute for the reference clock 350. For example, if two ASYNC modules are connected in a test site, or if two entire test sites are connected together, the reference clock from one ASYNC module may be connected to drive both modules. However, the external reference clock input 360 may be used to bring in a external high purity clock regardless of whether two ASYNC modules or two test sites are connected together.

DC/DC block. The DC/DC block 362 establishes power supply connections from a voltage source 364 (e.g. a 48V power source), perhaps from a mainframe, and converts it down to different voltages 366 needed by devices within the ASYNC module 300. The DC/DC block 362 also isolates grounds within the ASYNC module 300. The power on control inputs 346 are a group of signals received into the IF block 324 that can sequence power to the ASYNC module 300, so that once the voltage source 364 is active, the power on control information can sequence the turning on of circuits within the ASYNC module 300. For example, control circuitry can be powered up and configured before high-power circuitry is activated.

Example test program. For purposes of illustrating some of the features of embodiments of the present invention, the following is a simplified example test program written in pseudocode.

| [1] | Load pattern A |
| [2] | Load pattern B |
| [3] | Connect AWG1 TRIG1 to LSYNC |
| [4] | Set AWG1 to start on TRIG1 |
| [5] | Set AWG1 amplitude to 2V |
| [6] | Start pattern A |
| [7] | Wait for end pattern A |
| [8] | Connect AWG2 TRIG1 to PB Trig in // Digital Pin 200 |
| [9] | Start Pattern B |

Line 1 of the test program stores pattern A information, while line 2 stores pattern B information. Line 3 then configures the trigger matrix in the ASYNC module to connect the LSYNC trigger from the LSYNC module to a particular trigger input TRIG1 of a particular analog/mixed signal module AWG1, and line 4 instructs AWG1 to start when a trigger is received on TRIG1. Line 5 configures AWG1 to generate a signal with an amplitude of 2V.

When pattern A is started in line 6, in this example, part of pattern A is an output from the LSYNC trigger line, and a pulse may appear at a particular time. When the pulse is received at the ASYNC module, it is then routed to the TRIG1 input of AWG1. AWG1 will begin generating a 2V signal when this pulse is received on TRIG1.

Line 7 instructs the test site to wait until the end of pattern A is completed before resuming program control. When the end of pattern A is detected, line 8 then configures the trigger matrix in the ASYNC module to connect the PB trigger input to a particular trigger input TRIG1 of a particular analog/mixed signal module AWG2. The PB trigger input is connected to digital module pin 200 on the performance board (loadboard) in this example. When the pattern in the digital module is started in line 9, pattern B is generated. In this example, part of pattern B is an output on pin 200 of the digital module, and a pulse may appear at a particular time. When the pulse is received at the ASYNC module, it is then routed to the TRIG1 input of AWG2. AWG2 will begin generating a signal when this pulse is received on TRIG1.

In the example, because control comes from the digital modules, synchronization can be tightly controlled to be in the nanosecond range or better, as compared to synchronization of digital and analog modules from the test program, which can only be controlled in the tens of microseconds range.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for synchronizing one or more analog/mixed signal modules and one or more digital modules in an open architecture test system, comprising:
    a trigger matrix for receiving trigger control signals and configuring the trigger matrix in accordance with the trigger control signals to selectively route trigger signals to particular analog/mixed signal modules; and
    a clock matrix for receiving clock control signals and configuring the clock matrix in accordance with the clock control signals to selectively route clock signals to particular analog/mixed signal modules;
    wherein the clock signals are generated under pattern control by the digital modules;
    wherein the trigger signals are generated under pattern control by the digital modules or generated from the analog/mixed signal modules; and
    wherein the analog/mixed signal modules perform a particular activity upon receipt of the trigger signals.

2. The apparatus as recited in claim 1, the trigger matrix for additionally configuring the trigger matrix in accordance with the trigger control signals to selectively route trigger signals from the analog/mixed signal modules to particular digital modules;
    wherein the digital modules perform a certain activity upon receipt of the trigger signals.

3. The apparatus as recited in claim 1, further comprising:
    a variable clock generator for generating a variable clock;
    wherein the clock signals further include the variable clock from the variable clock generator.

4. The apparatus as recited in claim 1, further comprising:
    an interface circuit for receiving test program commands and converting them to the trigger and clock control signals.

5. The apparatus as recited in claim 4, the interface circuit for receiving enable control signals indicating whether a particular slot in the open architecture test system is occupied by an analog/mixed signal module, and for generating the trigger and clock control signals to route trigger and clock signals to particular analog/mixed signal modules only if the enable control signals indicate the presence of the particular analog/mixed signal modules.

6. A system for synchronizing analog/mixed signal modules and digital modules in an open architecture test system, comprising:
    one or more digital modules for generating first trigger signals and clock signals under pattern control;
    one or more analog/mixed signal modules for generating second trigger signals; and
    an analog sync module coupled between the digital modules and the analog/mixed signal modules for receiving test program commands and the clock signals and selectively routing particular first and second trigger signals and the clock signals to particular analog/mixed signal modules in accordance with the test program commands;
    wherein the analog/mixed signal modules perform a particular activity upon receipt of the first and second trigger signals.

7. The system as recited in claim 6, further comprising a digital sync circuit coupled between the analog sync module and the digital modules;
    wherein the analog sync module selectively routes particular second trigger signals from the analog/mixed signal modules to the digital sync circuit in accordance with the test program commands;
    wherein the digital sync circuit provides pattern control for the digital modules in accordance with the received particular second trigger signals; and
    wherein the digital modules perform a certain activity in accordance with the pattern control provided by the digital sync circuit.

8. The system as recited in claim 6, the analog sync module further comprising a variable clock generator for generating a variable clock;
    wherein the clock signals further include the variable clock from the variable clock generator.

9. The system as recited in claim 6, the digital modules further comprising one or more logic synchronization modules coupled to the analog sync module.

10. A method for synchronizing one or more analog/mixed signal modules and one or more digital modules in an open architecture test system, comprising:
    storing patterns into the digital modules;
    receiving trigger control signals;
    selectively routing trigger signals to particular analog/mixed signal modules in accordance with the trigger control signals;
    applying trigger signals from the analog/mixed signal modules or from the digital modules under pattern control to the particular analog/mixed signal modules;
    performing a particular activity in the analog/mixed signal modules upon receipt of the trigger signals;

receiving clock control signals;
selectively routing clock signals to particular analog/mixed signal modules in accordance with the clock control signals; and
applying clock signals from the digital modules under pattern control to the particular analog/mixed signal modules.

11. The method as recited in claim 10, further comprising:
selectively routing trigger signals from the analog/mixed signal modules to particular digital modules in accordance with the trigger control signals; and
performing a particular activity in the particular digital modules upon receipt of the trigger signals.

12. The method as recited in claim 10, wherein the clock signals further include a variable clock.

13. The method as recited in claim 10, further comprising:
receiving test program commands and converting them to the trigger and clock control signals.

14. The method as recited in claim 10, further comprising:
receiving enable control signals indicating whether a particular slot in the open architecture test system is occupied by an analog/mixed signal module; and
generating the trigger and clock control signals to route trigger and clock signals to particular analog/mixed signal modules only if the enable control signals indicate the presence of the particular analog/mixed signal modules.

15. A method for synchronizing analog/mixed signal modules and digital modules in an open architecture test system, comprising:
generating first trigger signals from one or more digital modules under pattern control;
generating second trigger signals from one or more analog/mixed signal modules;
receiving test program commands;
selectively routing particular first and second trigger signals to particular analog/mixed signal modules in accordance with the test program commands;
performing a particular activity in the analog/mixed signal modules upon receipt of the first and second trigger signals;
generating clock signals in the one or more digital modules under pattern control; and
selectively routing particular clock signals to particular analog/mixed signal modules in accordance with the test program commands.

16. The method as recited in claim 15, further comprising:
providing pattern control for the digital modules in accordance with particular second trigger signals; and
performing a certain activity in the digital modules in accordance with the provided pattern control.

17. The method as recited in claim 15, wherein the clock signals further include a variable clock.

18. The method as recited in claim 15, the digital modules further comprising one or more logic synchronization modules.

19. A method for synchronizing analog/mixed signal modules and digital modules in an open architecture test system, comprising:
storing patterns into the digital modules;
receiving trigger control signals;
selectively routing trigger input lines to particular analog/mixed signal modules in accordance with the trigger control signals;
specifying a start of a particular activity and parameters in the particular analog/mixed signal modules upon receipt of the trigger signals;
starting the patterns in the digital modules;
generating the trigger signals from the digital modules under pattern control;
applying the generated trigger signals to the trigger input lines to route the generated trigger signals to the particular analog/mixed signal modules;
receiving clock control signals;
selectively routing clock input lines to particular analog/mixed signal modules in accordance with the clock control signals;
starting the patterns in the digital modules;
generating the clock signals from the digital modules under pattern control; and
applying the generated clock signals to the clock input lines to route the generated clock signals to the particular analog/mixed signal modules.

20. The method as recited in claim 19, further comprising:
generating the trigger signals from the analog/mixed signal modules.

21. The method as recited in claim 19, wherein the clock signals further include a variable clock.

22. An apparatus for synchronizing one or more analog/mixed signal modules and one or more digital modules in an open architecture test system, comprising:
a trigger matrix for receiving trigger control signals and configuring the trigger matrix in accordance with the trigger control signals to selectively route trigger signals to particular analog/mixed signal modules only if a particular slot in the open architecture test system is occupied by the particular analog/mixed signal modules;
wherein the trigger signals are generated under pattern control by the digital modules or generated from the analog/mixed signal modules;
wherein the analog/mixed signal modules perform a particular activity upon receipt of the trigger signals.

* * * * *